(12) United States Patent
Kuo et al.

(10) Patent No.: US 10,281,502 B2
(45) Date of Patent: May 7, 2019

(54) MAXIMUM VOLTAGE SELECTION CIRCUIT

(71) Applicant: Taiwan Semiconductor Manufacturing Co., Ltd., Hsin-Chu (TW)

(72) Inventors: Chia-Chen Kuo, Hsin-Chu (TW); Chiting Cheng, Taichung (TW); Wei-Jer Hsieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/941,535

(22) Filed: Mar. 30, 2018

(65) Prior Publication Data

US 2018/0348264 A1    Dec. 6, 2018

Related U.S. Application Data

(60) Provisional application No. 62/513,358, filed on May 31, 2017.

(51) Int. Cl.
*G01R 19/165* (2006.01)
*G01R 19/04* (2006.01)
*H03K 19/0944* (2006.01)
*H03K 19/00* (2006.01)
*G01R 19/00* (2006.01)

(52) U.S. Cl.
CPC ... *G01R 19/16519* (2013.01); *G01R 19/0038* (2013.01); *G01R 19/04* (2013.01); *H03K 19/0013* (2013.01); *H03K 19/0944* (2013.01)

(58) Field of Classification Search
CPC .................. G01R 19/16519; G01R 19/0038
See application file for complete search history.

(56) References Cited

U.S. PATENT DOCUMENTS 8,022,574 B2 *   9/2011   Ryoo .................. H02J 1/10
                                                 307/80

* cited by examiner

*Primary Examiner* — Daniel C Puentes
(74) *Attorney, Agent, or Firm* — Duane Morris LLP (57) ABSTRACT

A voltage selection circuit includes: a power detection circuit configured to compare an output voltage with a first input voltage and a second input voltage, respectively; a latch circuit, coupled to the power detection circuit, and configured to flip respective logic states of a pair of output signals when the output voltage is lower than either the first input voltage or the second input voltage; and a selection circuit, coupled to the latch circuit, and configured to use either the first input voltage or the second input voltage as the output voltage based on the respective logic states of the pair of output signals.

17 Claims, 10 Drawing Sheets

MAXIMUM VOLTAGE SELECTION CIRCUIT

CROSS-REFERENCE TO RELATED APPLICATION

The present application claims priority to U.S. Provisional Patent Application No. 62/513,358, filed on May 31, 2017, which is incorporated by reference herein in its entirety.

BACKGROUND

Various semiconductor devices use a voltage source selection circuit to select and output one of a plurality of input voltages. Among a more general class of voltage source selection circuits, a maximum voltage selection circuit is a circuit that selects a highest power supply voltage among a plurality of power supply voltages to ensure stable operation of a coupled device/circuit. For example, a maximum voltage selection circuit may be used to stably operate a power supply gate of a voltage boost circuit such as, for example, a DC-to-DC converter.

Conventional maximum voltage selection circuits, however, generally rely on an operational amplifier to compare the plurality of to-be selected power supply voltages, and operating such an operational amplifier requires using a dedicated bias circuit, which disadvantageously consumes additional power. Thus, conventional maximum voltage selection circuit are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a voltage selection circuit, e.g., a maximum voltage selection circuit configured to select a maximum voltage from at least a first input voltage and a second input voltage as an output voltage. Further, in some embodiments, the maximum voltage selection circuit dynamically monitors the output voltage that has been equal to one of the first and second input voltages. When the output voltage drops below the other one of the first and second input voltages, the maximum voltage selection circuit automatically selects the other one of the first and second input voltages as its output voltage. Different from the conventional maximum voltage selection circuits that requires using operational amplifiers powered by a dedicated bias circuit to compare the first and second input voltages, the disclosed maximum voltage selection circuit uses a comparator that includes a plurality of transistors each operating under a sub-threshold mode (i.e., each transistor only conducts a sub-threshold current) to perform the comparison operation, according to some embodiments. As such, the above-mentioned issue of additional power consumption may be advantageously minimized in the disclosed maximum voltage selection circuit.

Figure 1:
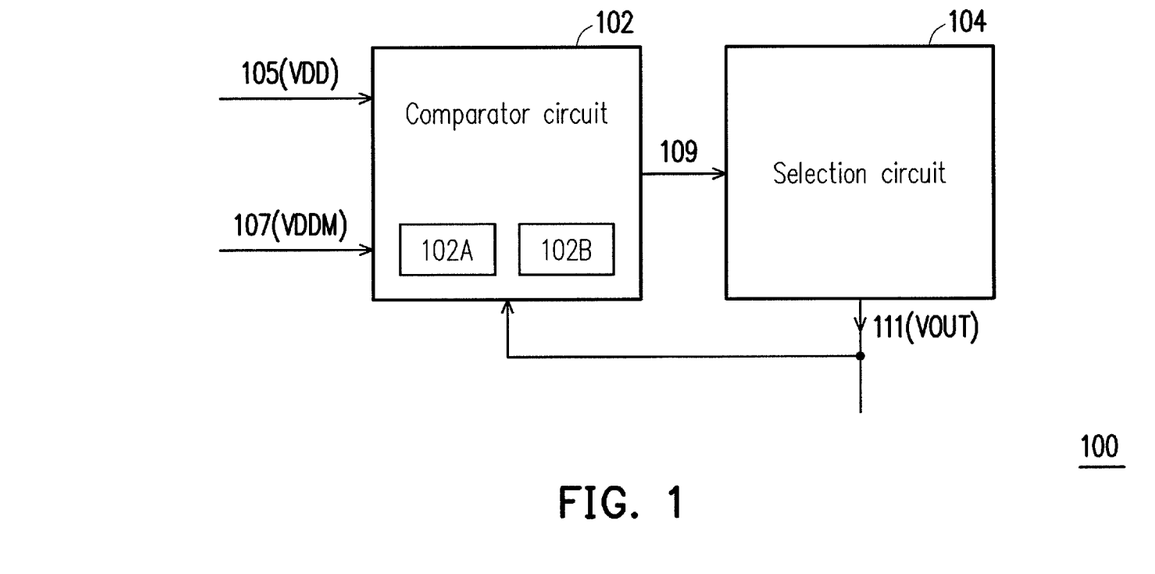
FIG. 1 illustrates an exemplary block diagram of a maximum voltage selection circuit, in accordance with some embodiments.

FIG. 1 illustrates an exemplary block diagram of a maximum voltage selection circuit 100 including a comparator circuit 102 and a selection circuit 104 coupled to the comparator circuit 102, in accordance with some embodiments. In some embodiments, the maximum voltage selection circuit 100 is configured to select one from an input voltage 105 (hereinafter "VDD") and an input voltage 107 (hereinafter "VDDM") that has the higher (voltage) level, and delivers it as an output voltage 111 (hereinafter "VOUT"). In other words, during a steady state, the VOUT 111 is equal to the higher one of the VDD 105 and VDDM 107. Over the time, the input voltage VDD 105 and VDDM 107 may vary, and when the lower one of the VDD 105 and VDDM 107 transitions to become higher than the VOUT 111 that is equal to the previously higher one of the VDD 105 and VDDM 107, the maximum voltage selection circuit 100 may re-select the previously lower one of the VDD 105 and VDDM 107 as the VOUT 111.

More specifically, in some embodiments, the comparator circuit 102 uses a power detection circuit 102A to dynamically detect (e.g., compare) whether the VOUT 111, output by the selection circuit 104, is lower than either the VDD 105 or VDDM 107. For example, the VOUT 111 has been equal to, or substantially close to, the VDD 105 and higher than the VDDM 107, but becomes lower than VDDM 107 (e.g., because the VDDM 107 is increasing), or the VOUT 111 has been equal to, or substantially close to, the VDDM 107 and higher than the VDD 105, but now becomes lower than VDD 105 (e.g., because the VDD 105 is increasing). If so (e.g., any of the above cases occur), the power detection circuit 102A may cause a latch circuit 102B, included also in the comparator circuit 102, to change (e.g., flip) the comparator circuit 102's output signal 109. In response to the change of the output signal 109, the selection circuit 104 can re-select the currently higher one between the VDD 105 and VDDM 107 as the VOUT 111. Detailed operations of the maximum voltage selection circuit 100 will be discussed in further detail below.

Figure 2:
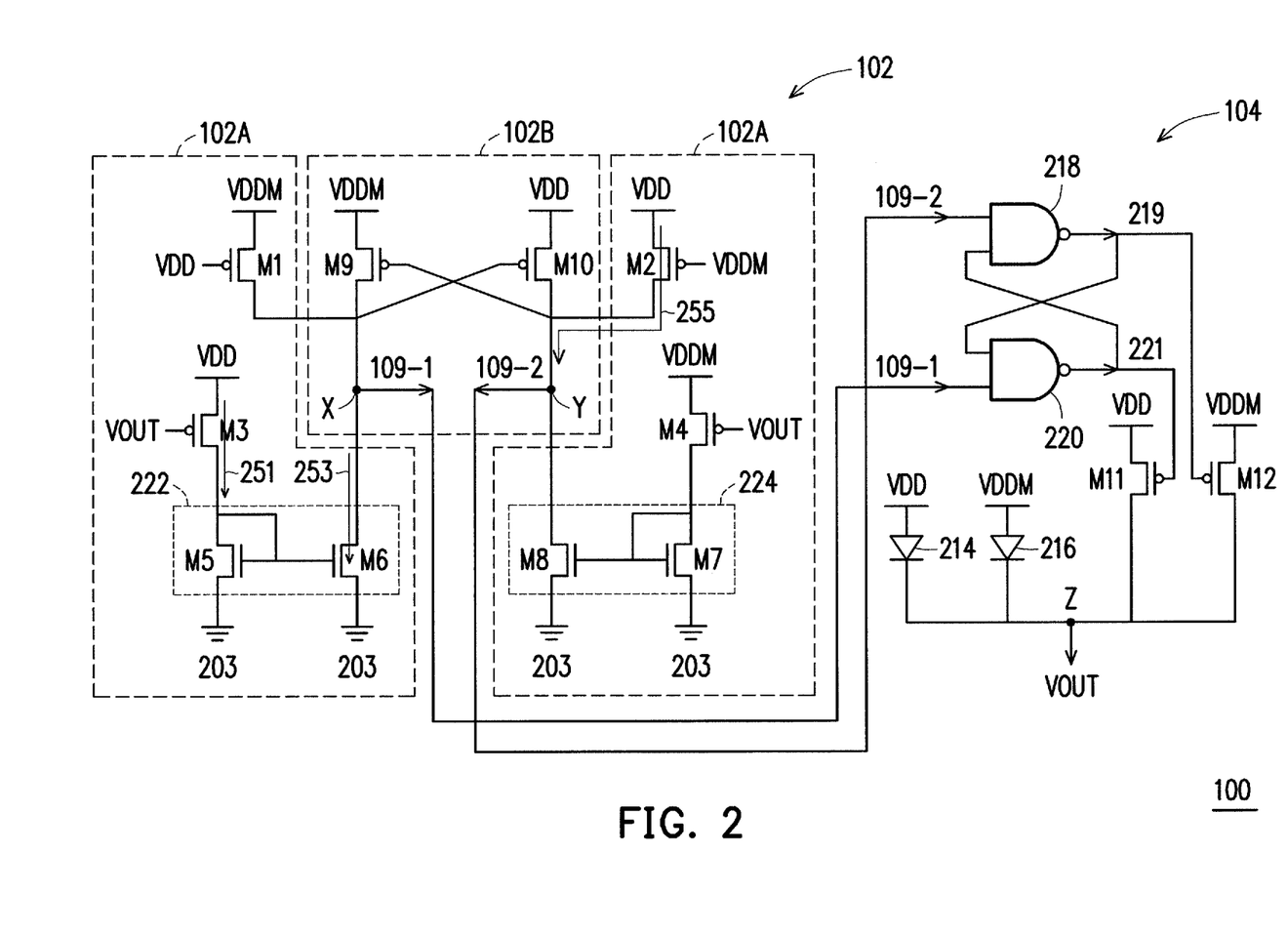
FIG. 2 illustrates an exemplary circuit diagram of the maximum voltage selection circuit of FIG. 1, in accordance with some embodiments.

FIG. 2 illustrates an exemplary circuit diagram of the maximum voltage selection circuit 100, in accordance with some embodiments. It is noted that the circuit diagram shown in FIG. 2 is merely one of various embodiments of the maximum voltage selection circuit 100. More other embodiments of the maximum voltage selection circuit 100 will be illustrated and discussed with respect to FIGS. 4, 5, 6, 7, 8, 9, and 10, respectively. In the illustrated embodiment of FIG. 2, the power detection circuit 102A of the comparator 102 of the maximum voltage selection circuit 100 includes transistors: M1, M2, M3, M4, M5, M6, M7, and M8; the latch circuit 102B of the comparator 102 of the maximum voltage selection circuit 100 includes transistors M9 and M10; and the selection circuit 104 of the maximum voltage selection circuit 100 includes transistors M11 and M12, diodes 214 and 216, logic gates (e.g., NAND gates) 218 and 220. In some embodiments, when the maximum voltage selection circuit 100 operates, each of the transistors M1 to M10 may operate under a sub-threshold mode (i.e., |Vgs|<|Vt|, wherein Vgs represents a voltage drop across respective gate and source, and Vt represents a respective threshold voltage).

In some embodiments, the transistors M5, M6, M7, and M8 each includes an n-channel metal-oxide-semiconductor field-effect-transistor (NMOSFET), and M1, M2, M3, M4, M9, M10, M11, and M12 each includes a p-channel metal-oxide-semiconductor field-effect-transistor (PMOSFET). Although the illustrated embodiments of FIG. 2A shows that M1-M12 are either NMOS or PMOS transistors, any of a variety of transistors or devices may be implemented as at least one of M11-M12 such as, for example, a bipolar junction transistor (BJT), a high-electron mobility transistor (HEMT), etc. Further, in some embodiments, the transistors M1, M2, M3, M4, M11, and M12 each presents an ultra-low threshold voltage, and the transistors M5, M6, M7, M8, M9, and M10 each presents a standard threshold voltage. Alternatively stated, the respective threshold voltages of the transistors M1, M2, M3, M4, M11, and M12 are typically lower than the respective threshold voltages of the transistors M5, M6, M7, M8, M9, and M10. For example, the transistor M1 may have a threshold voltage that is about 0.1 volts (V), and the transistor M9 may have a higher threshold voltage that is about 0.3 volts (V).

Referring first to the power detection circuit 102A of the comparator 102, in some embodiments, the transistors M3 and M4 may serve as input transistors to receive the VOUT 111 fed back from the selection circuit 104 (FIG. 1), and based on the magnitudes (i.e., voltage levels) of the VDD 105 and the VDDM 107, the power detection circuit 102A may cause logic states present on nodes "X" and "Y" of the latch circuit 102B to flip, which will be discussed in further detail below.

In some embodiments, the transistors M1 and M2 are gated by the VDD 105 and VDDM 107, respectively (i.e., the transistors M1's and M2's gates are respectively coupled to the VDD 105 and VDDM 107), and sourced from the VDDM 107 and VDD 105, respectively (i.e., the transistors M1's and M2's sources are respectively coupled to the VDDM 107 and VDD 105), while drains of the transistors M1 and M2 are coupled to the nodes X and Y, respectively. As mentioned above, the transistors M3 and M4 serve as the input transistors of the comparator circuit 102. In particular, the transistors M3 and M4 are gated by the VOUT 111 (i.e., the transistors M1's and M2's gates are each coupled to the VOUT 111), and sourced from the VDD 105 and VDDM 107, respectively (i.e., the transistors M3's and M4's sources are respectively coupled to the VDD 105 and VDDM 107), while drains of the transistors M3 and M4 are coupled to a current mirror 222 formed by the transistors M5 and M6, and a current mirror 224 formed by the transistors M7 and M8, respectively. In the current mirror 222, the transistor M5's drain and gate are tied together, and coupled to the drain of the transistor M3 and further coupled to the gate of the transistor M6. Transistors M5's and M6's sources are both coupled to a reference voltage 203 (e.g., a ground voltage). And the transistor M6's drain is coupled to the node X. Similarly, in the current mirror 224, the transistor M7's drain and gate are tied together, and coupled to the drain of the transistor M4 and further coupled to the gate of the transistor M8. Transistors M7's and M8's sources are both coupled to the reference voltage 203 (e.g., a ground voltage). And the transistor M8's drain is coupled to the node Y.

Referring then to the latch circuit 102B of the comparator 102, in some embodiments, the transistors M9 and M10 are cross-coupled to each other. That is, the transistor M9's gate is coupled to the transistor M10's drain, and the transistor M10's gate is coupled to the transistor M9's drain. Further, the transistor M10's gate and the transistor M9's drain are coupled at the node X, and the transistor M9's gate and the transistor M10's drain are coupled at the node Y. In some embodiments, the transistor M9's source is coupled to the VDDM 107 and the transistor M10's source is coupled to the VDD 105. In some embodiments, the latch circuit 102B is configured to provide the output signal 109 at the nodes X and Y. More specifically, the output signal 109 includes signals 109-1 and 109-2, each of which has a respective logic state that is logically inverted to one another. The signal 109-1 is provided at the node X, and the signal 109-2 is provided at the node Y.

Referring to the selection circuit 104, in some embodiments, the NAND gate 218 is configured to receive the output signal 109-2 from the latch circuit 102B as one of its inputs; and the NAND gate 220 is configured to receive the output signal 109-1 from the latch circuit 102B as one of its inputs. Further, the NAND gate 218 is configured to receive a NAND'ed output 221 from the NAND gate 220 as the other one of its inputs; and the NAND gate 220 is configured to receive a NAND'ed output 221 from the NAND gate 220 as the other one of its inputs. In some embodiments, the NAND gates 218 and 220 may form an SR latch circuit. In some embodiments, the SR latch circuit, formed by the NAND gates 218 and 220, is configured to suppress against noise accompanying with the output signals 109-1 and 109-2. It is noted that such an SR latch circuit may be formed by any of other logic gates (e.g. NOR gates) while remaining within the scope of the present disclosure.

In some embodiments, the transistor M11 is gated by the NAND'ed signal 221, and sourced from the VDDM 107 (i.e., the transistor M11's gate is coupled to an output of the NAND gate 220, and source is coupled to the VDDM 107); and the transistor M12 is gated by the NAND'ed signal 219, and sourced from the VDD 105 (i.e., the transistor M12's gate is coupled to an output of the NAND gate 218, and source is coupled to the VDD 105). In some embodiments, the transistors M11's and M12's drains are both coupled to a node "Z," which presents the VOUT 111. In some embodiments, the transistors M11 and M12 each functions as a switch to pass either the VDD 105 or the VDDM 107 to the node Z (i.e., using either the VDD 105 or the VDDM 107 as the VOUT 111), which will be discussed below.

In some embodiments, the diode 214 is coupled to the VDD 105 and the VOUT 111 at its respective anode and cathode; and similarly, the diode 216 is coupled to the VDDM 107 and the VOUT 111 at its respective anode and cathode. In some embodiments, the diodes 214's and 216's cathodes are both coupled to the node Z that presents the VOUT 111. In some embodiments, the diodes 214 functions as a fuse to make sure that the VOUT 111 does not drop below a threshold voltage that can be defined by the VDD 105 minus a forward voltage of the diode 214 (e.g., 0.7 volts (V)); and similarly, the diodes 216 functions as a fuse to make sure that the VOUT 111 does not drop below a threshold voltage that can be defined by the VDDM 107 minus a forward voltage of the diode 216 (e.g., 0.7 volts (V)).

Figure 3:
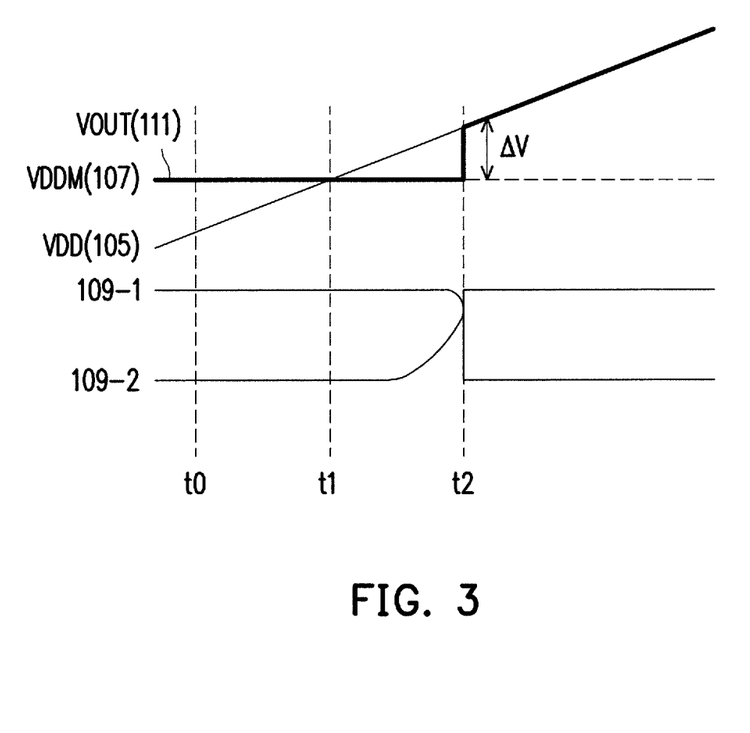
FIG. 3 illustrates exemplary waveforms of plural signals to operate the maximum voltage selection circuit of FIG. 1, in accordance with some embodiments.

As mentioned above, during the steady state of the maximum voltage selection circuit 100, the higher one of the VDD 105 and VDDM 107 has been selected by the maximum voltage selection circuit 100, such that the VOUT 111 is equal to, or substantially close to, the higher one of the VDD 105 and VDDM 107, for example, the VDDM 107. In some scenarios, over the time, the input voltage VDD 105 may rise up while the VDDM 107 remains substantially unchanged, and when the VDD 105 become higher than the VOUT 111 (i.e., the VOUT 111 becomes lower than the VDD 105 while being equal to the VDDM 107), the maximum voltage selection circuit 100 may re-select the VDD 105 as an updated VOUT 111. FIG. 3 illustrates such a scenario where the VOUT 111 was originally selected to be equal to one of the VDD 105 and the VDDM 107 (e.g., the VDDM 107), and then re-selected to be equal to the other of the VDD 105 and the VDDM 107 (e.g., the VDD 105).

As shown in FIG. 3, prior to time "t0," since the VDD 105 is lower than the VDDM 107, the maximum voltage selection circuit 100 has selected the VDDM 107 as the VOUT 111 so that the VOUT 111 substantially follows the VDDM 107. In some embodiments, when the VOUT 111 has followed the VDDM 107 (because VDDM 107>VDD 105) for a while, the output signals 109-1 and 109-2 may remain at logic high and low, respectively, as shown in FIG. 3. It is noted that such a selection between the VDD 105 and the VDDM 107 may be performed by at least some of the operations that will be discussed below.

While the VDDM 107 remains substantially unchanged, at time "t1," the VDD 105 rises up and surpasses the VOUT 111 (and also the VDDM 107 in the current example), at least some of the following operations may be performed by the maximum voltage selection circuit 100 to cause the VOUT 111 to be equal to, or substantially close to, the VDD 105. For example, when VDD 105 becomes higher than the VOUT 111, the transistors M2 and M3 are each biased under a positive Vsg (a voltage drop from a source to gate) while the transistors M1 and M4 are each biased under a negative Vsg because VDD 105>VDDM 107. As mentioned above, the transistors M1 to M10 each operates under the sub-threshold mode according to some embodiments. As such, a sub-threshold current 251 flowing through the transistor M3 and a sub-threshold current 255 flowing through the transistor M2 are increased, respectively, while a sub-threshold current (now shown) flowing through the transistor M1 and a sub-threshold current (not shown) flowing through the transistor M4 remain unchanged or even decrease, respectively. Therefore, the increased sub-threshold current 251 is mirrored by the current mirror 222, from the transistor M5 to the transistor M6, so as to start discharging a voltage level at the node X (i.e., the output signal 109-1). And, concurrently, the increased sub-threshold current 255 may use the VDD 105 (connected at the transistor M2's source) to starting charging a voltage level at the node Y (i.e., the output signal 109-2).

Next, while the VDD 105 keeps rising up and the VDDM 107 remains substantially unchanged, at time "t2," a large enough voltage difference ΔV (e.g., about 10 millivolts (mV) to 50 mV) between the VDD 105 and the VDDM 107 is present so as to allow the transistors M6 and M2 to flip the logic states of the output signals 109-1 and 109-2 of the latch circuit 102B. For example, the logic states of the output signal 109-1 and 109-2 may be flipped to the logic low and high, respectively, as shown in FIG. 3. After the output signals 109-1 and 109-2 respectively flip to the logic low and high, the logic states of the output signals 109-1 and 109-2 are latched by the latch circuit 102B, and further latched by the SR latch circuit, formed by the NAND gates 218 and 220. Based on the operation principle of the SR latch circuit know in the art, the logic states of the NAND'ed signals 219 and 221 are the logic high and low, respectively. As such, the transistors M11 and M12, gated by the NAND'ed signals 219 and 221, are turned on and off, respectively. Therefore, the VDD 105 is coupled to the node Z so that the VOUT 111 then becomes (e.g., follows) the VDD 105, as illustrated in FIG. 3. In some embodiments, subsequent to the time 2, when the VDDM 107 rises up and becomes higher again then the VOUT 111 that follows the current VDD 105, the maximum voltage selection circuit 100 may follow the operation principle, discussed above, to re-select the VDDM 107 as the VOUT 111 and cause the VOUT 111 to follow the VDDM 107.

Figure 4:
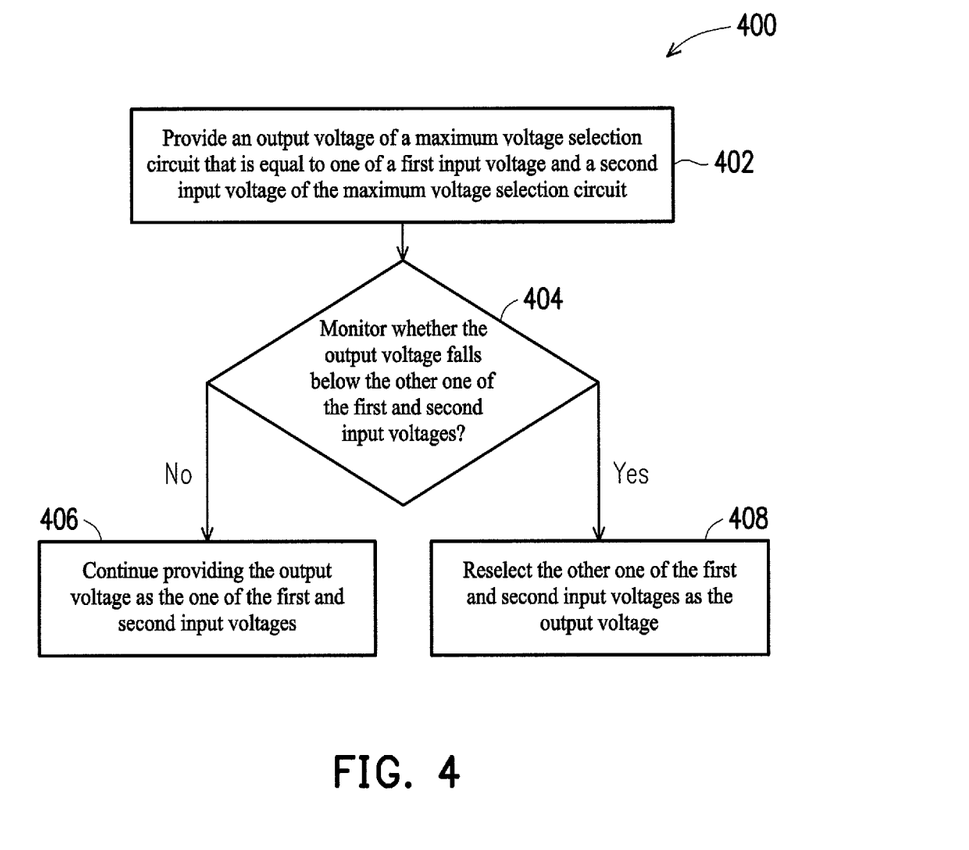
FIG. 4 illustrates a flow chart of an exemplary method to operate the maximum voltage selection circuit of FIG. 1, in accordance with some embodiments.

FIG. 4 illustrates a flow chart of an exemplary method 400 to operate the maximum voltage selection circuit 100, in accordance with various embodiments. In various embodiments, the operations of the method 400 are performed by the respective components illustrated in FIGS. 1-3. For purposes of discussion, the following embodiment of the method 400 will be described in conjunction with FIGS. 1-3. The illustrated embodiment of the method 400 is merely an example. Therefore, it should be understood that any of a variety of operations may be omitted, re-sequenced, and/or added while remaining within the scope of the present disclosure.

The method 400 starts with operation 402 in which an output voltage of a maximum voltage selection circuit is provided and equal to one of a first input voltage and a second input voltage of the maximum voltage selection circuit, in accordance with various embodiments. In the example illustrated above with respect to FIG. 3, the VOUT 111 of the maximum voltage selection circuit 100 is provided and equal to, or substantially close to, the VDDM 107.

The method 400 continues to determination operation 404 in which the output voltage is monitored to determine whether the output voltage falls below the other of the first and second input voltages, in accordance with various embodiments. Continuing with the above example, the maximum voltage selection circuit 100 uses the power detection circuit 102A to detect whether the VOUT 111 that has followed the VDDM 107 becomes lower than the VDD 105. If not (i.e., the VOUT 111, substantially equal to the VDDM 107, is still higher than the VDD 105), the method 400 proceeds to operation 406 in which the maximum voltage selection circuit 100 continue providing the VDDM 107 as the VOUT 111; and if not (i.e., the VOUT 111, substantially equal to the VDDM 107, becomes lower than the VDD 105), the method 400 proceeds to operation 408 in which the maximum voltage selection circuit 100 re-selects the VDD 105 as the VOUT 111, each of which will be discussed in further detail below.

In the operation 406, when the VOUT 111, substantially equal to the VDDM 107, is still higher than the VDD 105, the logic states of the output signals 109-1 and 109-2 of the latch circuit 102B of the maximum voltage selection circuit 100 may remain unchanged, in accordance with various embodiments. Accordingly, the logic states of the NAND'ed signals 219 and 221 also remain unchanged so that the selection circuit 104 of the maximum voltage selection circuit 100 continues coupling the VDDM 107 to the VOUT 111.

In the operation 408, when the VOUT 111, substantially equal to the VDDM 107, becomes lower than the VDD 105, at least two transistors (e.g., M2 and M3) that operates under the sub-threshold mode of the power detection circuit 102A of the maximum voltage selection circuit 100 may respectively flip the logic states of the output signals 109-1 and 109-2 (e.g., to the logic low and logic high, respectively), in accordance with various embodiments. As such, the logic states of the NAND'ed signals 219 and 221 are also flipped, respectively, so that the selection circuit 104 of the maximum voltage selection circuit 100 re-selects the VDD 105 to be coupled to the VOUT 111.

Figure 5:
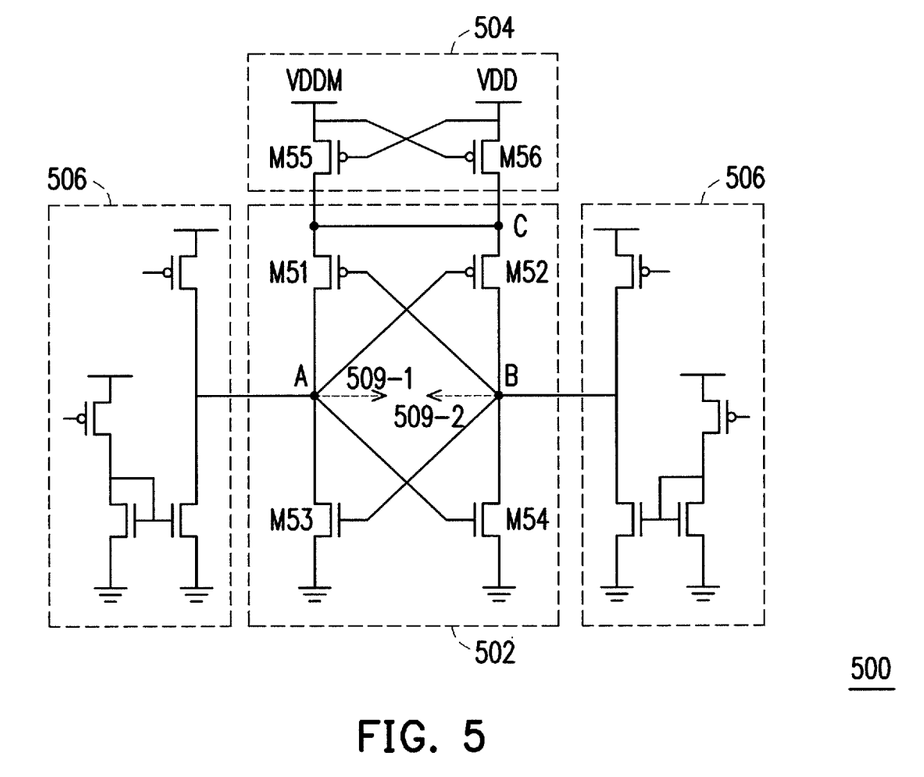
FIG. 5-10 each illustrates a circuit diagram of an alternative embodiment of the maximum voltage selection circuit of FIG. 1, in accordance with some embodiments.

As mentioned above, the maximum voltage selection circuit 100 may be implemented by various other embodiments, which will be respectively discussed below with respect to FIGS. 5-10. FIG. 5 illustrates a maximum voltage selection circuit 500 that is substantially similar to the maximum voltage selection circuit 100 except that a full latch circuit 502 and a coupled latch supply control circuit 504 are used. In particular, the maximum voltage selection circuit 500 includes a power detection circuit 506 that is substantially similar to the power detection circuit 102A of the maximum voltage selection circuit 100, and a selection circuit (not shown) that substantially similar to the selection circuit 104 of the maximum voltage selection circuit 100, such that discussions of the power detection circuit 506 and the selection circuit of the maximum voltage selection circuit 500 are not repeated here.

In some embodiments, the full latch circuit 502 includes transistors: M51, M52, M53, and M54; and the latch supply control circuit 504 includes transistors: M55 and M56. In some embodiments, the transistors M53 and M54 each includes the n-channel metal-oxide-semiconductor field-effect-transistor (NMOSFET), and M51, M52, M55, and M56 each includes the p-channel metal-oxide-semiconductor field-effect-transistor (PMOSFET). Although the illustrated embodiments of FIG. 5 shows that M51-M56 are either NMOS or PMOS transistors, any of a variety of transistors or devices may be implemented as at least one of M51-M56 such as, for example, a bipolar junction transistor (BJT), a high-electron mobility transistor (HEMT), etc. Further, in some embodiments, the transistors M51, M52, M53, M54, M55, and M56 each presents a standard threshold voltage. For example, the transistors M51-M56 may each have a threshold voltage that is about 0.3 (V).

In some embodiments, the transistors M51-M54 of the full latch circuit 502 are cross-coupled to each other. That is, the transistor M51's gate is coupled to the transistor M52's drain, to the transistor M54's drain, and to the transistor M53's gate; and the transistor M52's gate is coupled to the transistor M51's drain, to the transistor M53's drain, and to the transistor M54's gate. The transistors M53's and M54's sources are each coupled to ground. Further, the transistor M52's gate and the transistor M54's gate are coupled at node A; and the transistor M51's gate and the transistor M53's gate are coupled at node B. In some embodiments, the transistor M51's source is coupled to the VDDM 107 through the latch supply control circuit 504, and the transistor M52's source is coupled to the VDD 105 through the latch supply control circuit 504. In some embodiments, the latch circuit 502 is configured to provide output signals 509-1 and 509-2 at the nodes A and B, each of which has a respective logic state that is logically inverted to one another.

Similar to the operation of the latch circuit 102B of the maximum voltage selection circuit 100 that the respective logic states of the output signals 109-1 and 109-2 are determined by the power detection circuit 102A, the respective logic states of the output signals 509-1 and 509-2 are also determined by the power detection circuit 506, which is substantially similar to the power detection circuit 102A. Still similarly, such output signals 509-1 and 509-2 are provided to the coupled selection circuit (now shown) so as to select which of the VDD 105 and VDDM 107 to be used as the VOUT 111. Thus, discussions regarding how the respective logic states of the output signals 509-1 and 509-2 are determined and how the VDD 105 or VDDM 107 is selected as the VOUT 111 are not repeated here.

In some embodiments, in the latch supply control circuit 504, the transistor M55's source is coupled to the VDDM 107, gate is coupled to the transistor M56's source, and drain is coupled to the transistor M51 of the full latch circuit 502; and the transistor M56's source is coupled to the VDD 105, gate is coupled to the transistor M55's source, and drain is coupled to the transistor M52 of the full latch circuit 502. More particularly, the transistors M55's and M56's respective drains are tied together at a node C. By coupling the latch supply circuit 504 in such a configuration, various advantages may be provided. For example, when the VDD 105 is substantially close to the VDDM 107, the transistors M55 and M56 may become weak (e.g., flowing substantially low currents). As such, a voltage level at the node C, which may serve as a common supply voltage for the full latch circuit 502, may be reduced to cause the logic states of the output signals 509-1 and 509-2 to be more easily flipped.

Figure 6:
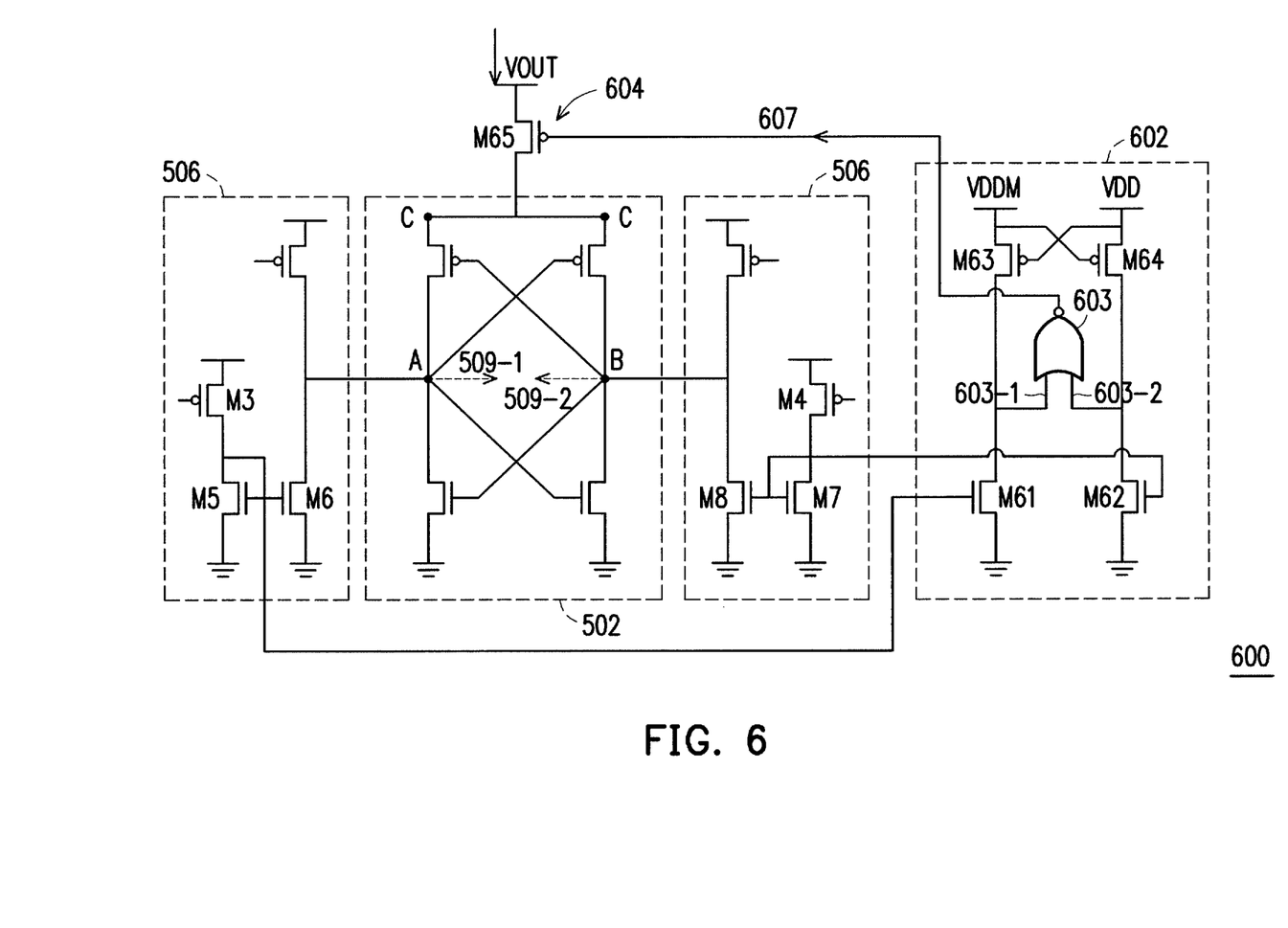

FIG. 6 illustrates a maximum voltage selection circuit 600 that is substantially similar to the maximum voltage selection circuit 600 except that the maximum voltage selection circuit 600 does not include the latch supply control circuit 504 but further includes a proximity detection circuit 602 and a coupled cut-off switch 604. In some embodiments, the cur-off switch 604 is configured to couple a selection circuit (not shown) that is substantially similar to the selection circuit 104 of the maximum voltage selection circuit 100 to the full latch circuit 502. In particular, the maximum voltage selection circuit 600 includes the full latch circuit 502, the power detection circuit 506, and a selection circuit (not shown) that substantially similar to the selection circuit 104 of the maximum voltage selection circuit 100, such that discussions of the full latch circuit 502, the power detection circuit 506, and the selection circuit of the maximum voltage selection circuit 600 are not repeated here.

In some embodiments, the proximity detection circuit 602 includes transistors M61, M62, M63, and M64, and a NOR gate 603; and the cut-off switch 604 includes a transistor M65. In some embodiments, the transistors M61 and M62 each includes the n-channel metal-oxide-semiconductor field-effect-transistor (NMOSFET), and M63, M64, and M65 each includes the p-channel metal-oxide-semiconductor field-effect-transistor (PMOSFET). Although the illustrated embodiments of FIG. 6 shows that M61-M65 are either NMOS or PMOS transistors, any of a variety of transistors or devices may be implemented as at least one of M61-M65 such as, for example, a bipolar junction transistor (BJT), a high-electron mobility transistor (HEMT), etc. Further, in some embodiments, the transistors M63 and M64 each presents an ultra-low threshold voltage, and the transistors M61, M62, and M65 each presents a standard threshold voltage. For example, the transistors M61-M65 may each have a threshold voltage that is about 0.3 (V), and the transistors M63 and M64 may each have a threshold voltage that is about 0.1 (V).

In some embodiments, the transistors M61's gate and M62's gate are respectively coupled to the power detection circuit 506 that is substantially similar to the power detection circuit 102A of FIG. 2 such that some references of the power detection circuit 102A are used here. For example, the transistor M61's gate is coupled to the transistors M3's drain, M5's gate and drain, and M6's gate; and the transistor M62's gate is coupled to the transistors M4's drain, M7's gate and drain, and M8's gate. Further, the transistors M61's and M62's sources are respectively coupled to ground, and drains are respectively coupled to the NOR gate 603 as its inputs. In some embodiments, the NOR gate 603 may NOR signals 603-1 and 603-2 respectively present on the drains of the transistors M61 and M62 to provide a latch block signal 607 to turn on and off the cut-off switch 604, which will be discussed below. The transistors M61's and M62's drains are further coupled to drains of the transistors M63 and M64, respectively. The transistor M63's source is coupled to the VDDM 107, and gate is coupled to the transistor M64's source; and the transistor M64's source is coupled to the VDD 105, and gate is coupled to the transistor M63's source.

By coupling the proximity detection circuit 602 to control the cut-off switch 604, various advantages may be provided. For example, when the VDD 105 is substantially close to the VDDM 107, the comparator circuit of the maximum voltage selection circuit 600, which is formed by the full latch circuit 502 and the power detection circuit 506, may become sensitive to noise accompanying with the VOUT 111. In some embodiments, the proximity detection circuit 602 can dynamically monitor the VDD 105 and VDDM 107, and when the VDD 105 is substantially close to the VDDM 107, the proximity detection circuit 602 may turn off the cut-off switch 604 so as to minimize the noise accompanying with the VOUT 111. Also, by turning off the cut-off switch 604, the voltage level at node C may be reduced to cause the logic states of the output signals 509-1 and 509-2 to be more easily flipped.

More specifically, in some embodiments, when VDD 105 is substantially close to the VDDM 107, the transistors M61 and M62 are respectively turned on so that the signals 603-1 and 603-2 are each pulled to the logic low. The NOR gate 603 NOR'es the both logic low inputs 603-1 and 603-2 to produce a logic high latch block signal 607. When the latch block signal 607 is at the high logic state, the cut-off switch 604 is turned off so that the selection circuit is isolated from the full latch circuit 502 and the voltage level at the node C is reduced, as described above.

In some embodiments, FIGS. 7-10 respectively illustrate circuit diagrams of plural alternative embodiments of the maximum voltage selection circuit 100. In general, each of the alternative embodiments of the maximum voltage selection circuit 100 in FIGS. 7-10 includes a sub-threshold voltage comparator, which is substantially similar to the power detection circuit 102A of the maximum voltage selection circuit 100 (FIG. 2), and a pair of headers, which are each substantially similar to the switch M11/M12 of the maximum voltage selection circuit 100 (FIG. 2). And the sub-threshold voltage comparator is configured to monitor the VOUT 111, and when the VOUT 111 drops below either the VDD 105 or the VDDM 107, the sub-threshold voltage comparator reduces voltage levels received at respective gates of the headers to conduct more current so as to pull up the VOUT 111.

Figure 7:
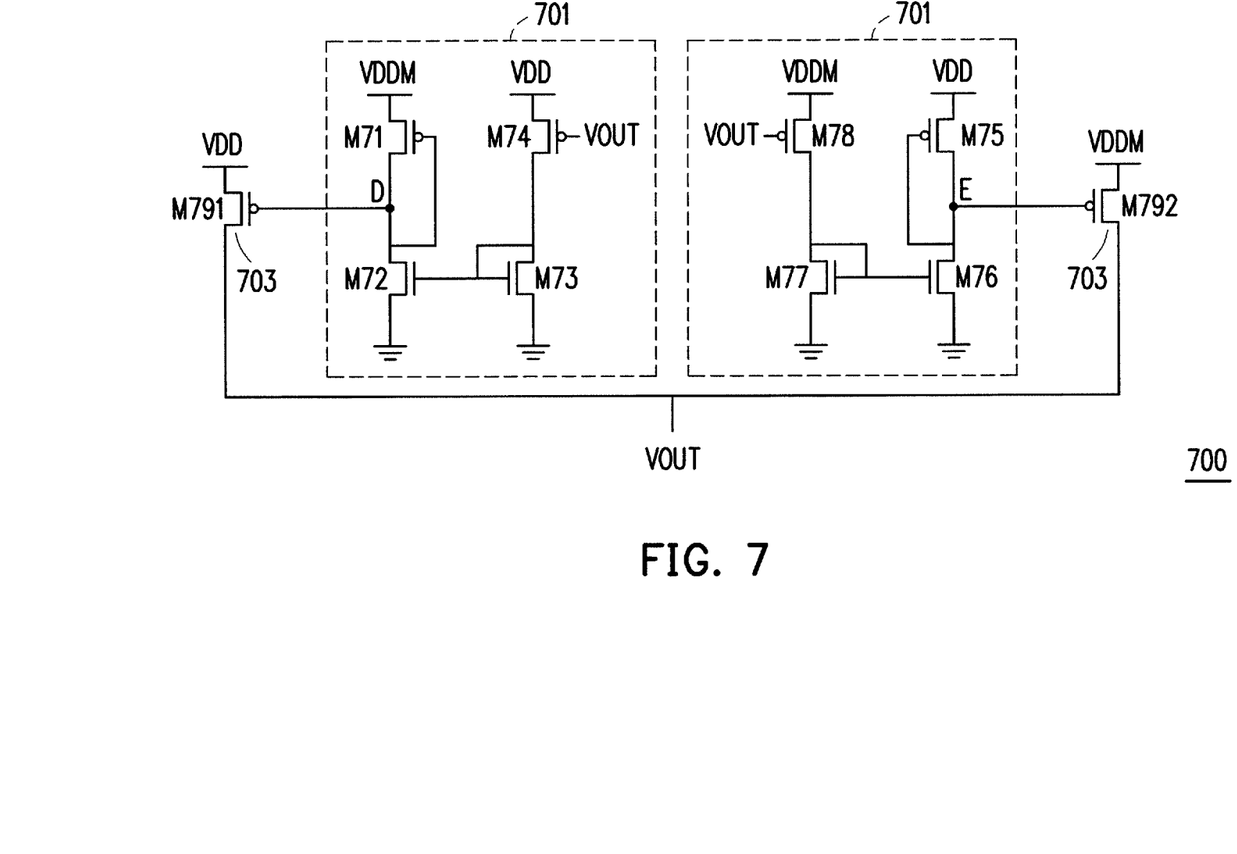

Referring first to FIG. 7, a circuit diagram of an alternative embodiment of the maximum voltage selection circuit 100 is illustrated. For purpose of clarity, the alternative embodiment is herein referred to as a maximum voltage selection circuit 700. In the illustrated embodiment of FIG. 7, the maximum voltage selection circuit 700 includes a sub-threshold voltage comparator 701 formed by transistors M71, M72, M73, M74, M75, M76, M77, and M78, and a pair of headers 703 formed by transistors M791 and M792. As the name implies, in some embodiments, when the maximum voltage selection circuit 700 operates, each of the transistors M71-M78 of the sub-threshold voltage comparator 701 may operate under a sub-threshold mode.

In some embodiments, the transistors M72, M73, M76, and M77 each includes the re-channel metal-oxide-semiconductor field-effect-transistor (NMOSFET), and M71, M74, M75, M78, M791, and M792 each includes the p-channel metal-oxide-semiconductor field-effect-transistor (PMOSFET). Although the illustrated embodiments of FIG. 7 shows that M71-M78, and M791-M792 are either NMOS or PMOS transistors, any of a variety of transistors or devices may be implemented as at least one of M71-M78, and M791-M792 such as, for example, a bipolar junction transistor (BJT), a high-electron mobility transistor (HEMT), etc. Further, in some embodiments, the transistors M71-M78, and M791-M792 each presents an ultra-low threshold voltage. For example, the transistor M71-M78, and M791-M792 may each have a threshold voltage that is about 0.1 volts (V).

In some embodiments, in the sub-threshold voltage comparator 701, the transistors M71 and M75 are diode-connected (i.e., respective drain and gate are tied together), and more specifically, the transistor M71's source is coupled to the VDDM 107 and the transistor M75's source is coupled to the VDD 105. The transistors M72 and M73 are formed as a first current mirror, similar to the current mirror 222 (FIG. 2), and the transistors M76 and M77 are formed as a second current mirror, similar to the current mirror 224 (FIG. 2). And the transistor M71 is coupled to the first current mirror at a node D by its respective drain, and the transistor M75 is coupled to the second current mirror at a node E by its respective drain. Further, the first and second current mirrors are respectively coupled to the transistors M74 and M78 at their respective drains. The transistor M74 is gated by the VOUT 111 and sourced from the VDD 105; and the transistor M78 is gated by the VOUT 111 and sourced from the VDDM 107. In some embodiments, the transistor M791 of the header 703 is coupled to the sub-threshold voltage comparator 701 at the node D; and the transistor M792 of the header 703 is coupled to the sub-threshold voltage comparator 701 at the node E. Further, the transistor M791's source is coupled to the VDD 105, and drain is coupled to the VOUT 111; and the transistor M792's source is coupled to the VDDM 107, and drain is coupled to the VOUT 111.

As described above, the sub-threshold voltage comparator 701 is configured to monitor the VOUT 111 by receiving it at the transistors M74's and M78's respective gates, and when the VOUT 111 drops below either the VDD 105 or the VDDM 107, the sub-threshold voltage comparator 701 reduces voltage levels received at respective gates of the headers 703, which are the voltage levels at the nodes D and E, to conduct more current (e.g., sub-threshold current) so as to pull up the VOUT 111 at respective drains of the headers 703. Operation principles of the sub-threshold voltage comparator 701 and the power detection circuit 102A are substantially similar with each other, so the discussion of the operation principle of the sub-threshold voltage comparator 701 is not repeated here.

Figure 8:
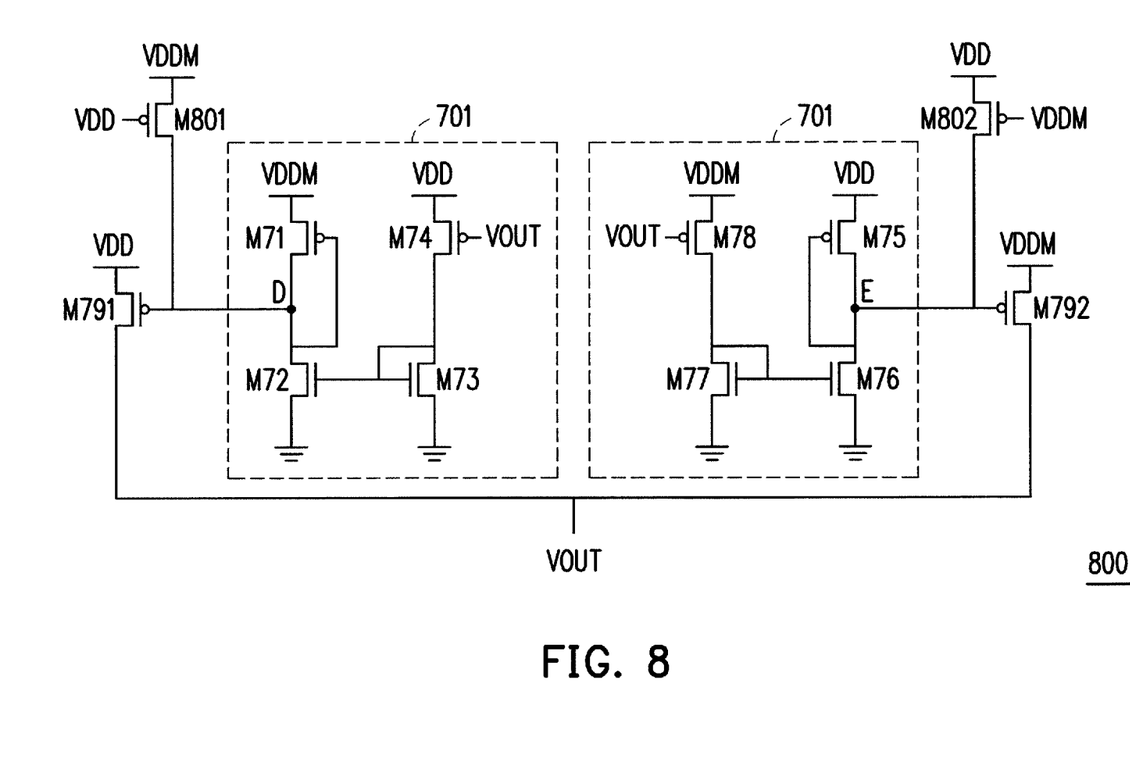

Referring to FIG. 8, a circuit diagram of another alternative embodiment of the maximum voltage selection circuit 100 is illustrated. For purpose of clarity, the alternative embodiment is herein referred to as a maximum voltage selection circuit 800. As shown, the maximum voltage selection circuit 800 is substantially similar to the maximum voltage selection circuit 700 except that the maximum voltage selection circuit 800 further includes two transistors M801 and M802. In some embodiments, the transistors M801 and M802 each includes the p-channel metal-oxide-semiconductor field-effect-transistor (PMOSFET). In some embodiments, the transistor M801's source is coupled to the VDDM 107, gate is coupled to the VDD 105, and drain is coupled to the gate of the transistor M791 (the header); and the transistor M802's source is coupled to the VDD 105, gate is coupled to the VDDM 107, and drain is coupled to the gate of the transistor M792 (the header). In some embodiments, the transistor M801 is configured to turn off the transistor M791 when the VDD 105>>the VDDM 107; and the transistor M802 is configured to turn off the transistor M792 when the VDD 105<<the VDDM 107.

Figure 9:
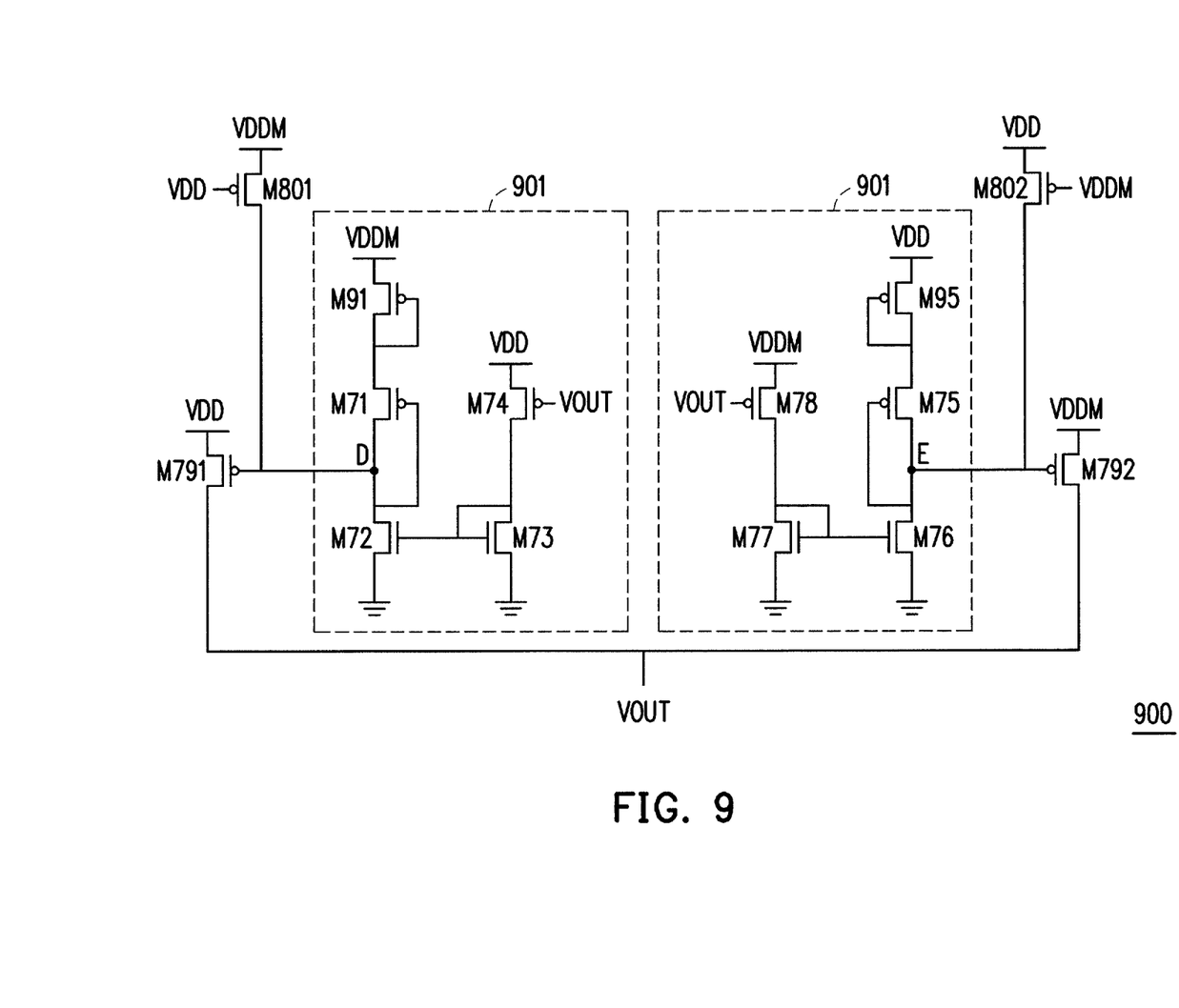

Referring to FIG. 9, a circuit diagram of another alternative embodiment of the maximum voltage selection circuit 100 is illustrated. For purpose of clarity, the alternative embodiment is herein referred to as a maximum voltage selection circuit 900. As shown, the maximum voltage selection circuit 900 is substantially similar to the maximum voltage selection circuit 800 except that a sub-threshold voltage comparator 901 of the maximum voltage selection circuit 900 further includes two diode-connected transistors M91 and M95 stacked between the VDDM 107 and the transistor M71, and between the VDD 105 and the transistor M75, respectively. In some embodiments, the transistors M91 and M95 each includes the p-channel metal-oxide-semiconductor field-effect-transistor (PMOSFET). In some embodiments, by including these two additional diode-connected transistors M91 and M95, a gain or operation point of the sub-threshold voltage comparator 901 can be adjusted accordingly. For example, by inserting the transistor M91, a voltage drop (e.g., a voltage drop from the transistor M91's source to drain) is introduced between VDDM 107 and the transistor M71's source so that the transistor M91 can conduct an output current of the current mirror formed by the transistors M72 and M73. Accordingly, the voltage at the transistor M71's drain will drop so as to maintain a sufficient VSG (i.e., the voltage drop from the transistor M71's source to drain) for the conducted output current, which in turn lowers the operation point of the sub-threshold voltage comparator 901, e.g., the gate of the transistor M791. Thus, the transistor M791 may conduct more current compared to the maximum voltage selection circuit 700 under a same VOUT/VDD/VDDM configuration.

Figure 10:
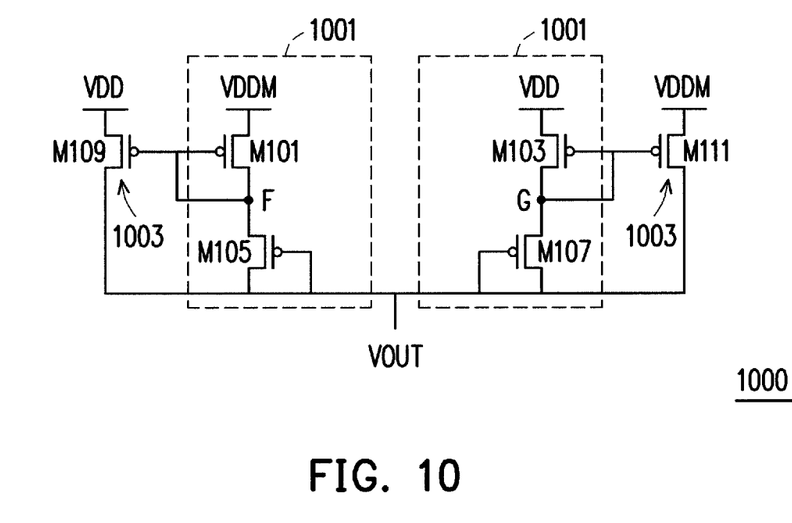

Referring to FIG. 10, a circuit diagram of another alternative embodiment of the maximum voltage selection circuit 100 is illustrated. For purpose of clarity, the alternative embodiment is herein referred to as a maximum voltage selection circuit 1000. As shown, the maximum voltage selection circuit 1000 is substantially similar to the maximum voltage selection circuit 700 except that a sub-threshold voltage comparator 1001 of the maximum voltage selection circuit 1000 includes a single stage.

In the illustrated embodiment of FIG. 10, the maximum voltage selection circuit 900 includes the sub-threshold voltage comparator 901 formed by transistors M101, M103, M105, and M107, and a pair of headers 1003 formed by transistors M109 and M111. As the name implies, in some embodiments, when the maximum voltage selection circuit 1000 operates, each of the transistors M101-M107 of the sub-threshold voltage comparator 1001 may operate under a sub-threshold mode.

In some embodiments, the transistors M101-M111 each includes the p-channel metal-oxide-semiconductor field-effect-transistor (PMOSFET). Although the illustrated embodiments of FIG. 10 shows that M101-M111 are PMOS transistors, any of a variety of transistors or devices may be implemented as at least one of M101-M111 such as, for example, a bipolar junction transistor (BJT), a high-electron mobility transistor (HEMT), etc. Further, in some embodiments, the transistors M101-M111 each presents an ultra-low threshold voltage. For example, the transistor M101-M111 may each have a threshold voltage that is about 0.1 volts (V).

In some embodiments, in the sub-threshold voltage comparator 1001, the transistors M101 and M103 are diode-connected (i.e., respective drain and gate are tied together), and more specifically, the transistor M101's drain and gate are connected at a node F and the transistor M103's drain and gate are connected at a node G. Further, the transistor M101's source is coupled to the VDDM 107 and the transistor M103's source is coupled to the VDD 105. The transistor M105's source is coupled to the node F, and drain and gate are both coupled to the VOUT 111; and the transistor M107's source is coupled to the node G, and drain and gate are both coupled to the VOUT 111. In some embodiments, the transistor M109 of the header 1003 is coupled to the sub-threshold voltage comparator 1001 at the node F; and the transistor M111 of the header 1003 is coupled to the sub-threshold voltage comparator 901 at the node G. Further, the transistor M109's source is coupled to the VDD 105, and drain is coupled to the VOUT 111; and the transistor M111's source is coupled to the VDDM 107, and drain is coupled to the VOUT 111.

In an embodiment, a voltage selection circuit includes: a power detection circuit configured to compare an output voltage with a first input voltage and a second input voltage, respectively; a latch circuit, coupled to the power detection circuit, and configured to flip respective logic states of a pair of output signals when the output voltage is lower than either the first input voltage or the second input voltage; and a selection circuit, coupled to the latch circuit, and configured to use either the first input voltage or the second input voltage as the output voltage based on the respective logic states of the pair of output signals.

In another embodiment, a voltage selection circuit configured to select a maximum voltage from at least a first input voltage and a second input voltage as an output voltage includes: a power detection circuit that comprises: a first transistor that is gated by the first input voltage and sourced from the second input voltage; a second transistor gated by the second input voltage and sourced from the first input voltage; a third transistor gated by the output voltage and sourced from the first input voltage; and a fourth transistor gated by the output voltage and sourced from the second input voltage; and a latch circuit, coupled to the power detection circuit, and configured to flip respective logic states of a pair of output signals when the output voltage is lower than either the first input voltage or the second input voltage.

Yet in another embodiment, a method includes: providing an output voltage of a voltage selection circuit that is selected to follow one of a first input voltage and a second input voltage of the voltage selection circuit; using a plurality of transistors that each operates under a sub-threshold mode to monitor whether the output voltage drops below the other of the first and second input voltages; and when the output voltage drops below the other of the first and second input voltages, flipping respective logic states of output signals of a latch circuit so as to cause the output voltage to follow the other of the first and second input voltages.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A voltage selection circuit, comprising:
    a power detection circuit configured to compare an output voltage with a first input voltage and a second input voltage, respectively;
    a latch circuit, coupled to the power detection circuit, and configured to flip respective logic states of a pair of output signals when the output voltage is lower than either the first input voltage or the second input voltage; and
    a selection circuit, coupled to the latch circuit, and configured to use either the first input voltage or the second input voltage as the output voltage based on the respective logic states of the pair of output signals, wherein the power detection circuit comprises:
        a first transistor gated by the first input voltage and sourced from the second input voltage;
        a second transistor gated by the second input voltage and sourced from the first input voltage;
        a third transistor gated by the output voltage and sourced from the first input voltage; and
        a fourth transistor gated by the output voltage and sourced from the second input voltage.

2. The circuit of claim 1, wherein each of the first, second, third, and fourth transistors comprises a p-type metal-oxide-semiconductor field-effect-transistor (PMOSFET).

3. The circuit of claim 1, wherein when the output voltage is equal to one of the first and second input voltages and lower than the other of the first and second input voltages, either currents flowing through the second and third transistors or currents flowing through the first and fourth transistors increase.

4. The circuit of claim 3, wherein the currents flowing through the second and third transistors and the currents flowing through the first and fourth transistors are each a sub-threshold current.

5. The circuit of claim 3, wherein when either the currents flowing through the second and third transistors or the currents flowing through the first and fourth transistors increase, the latch circuit flips the respective logic states of the pair of output signals.

6. The circuit of claim 1, wherein the selection circuit further comprises:

a first switch configured to couple the first input voltage to the output voltage in response to the logic state of one of the pair of output signals; and
    a second switch configured to couple the second input voltage to the output voltage in response to the logic state of the other of the pair of output signals.

7. The circuit of claim 1, wherein the selection circuit further comprises:
    an SR latch circuit configured to receive the respective logic states of the pair of output signals of the latch circuit as inputs.

8. A voltage selection circuit configured to select a maximum voltage from at least a first input voltage and a second input voltage as an output voltage, comprising:
    a power detection circuit that comprises:
        a first transistor that is gated by the first input voltage and sourced from the second input voltage; a second transistor gated by the second input voltage and sourced from the first input voltage; a third transistor gated by the output voltage and sourced from the first input voltage; and a fourth transistor gated by the output voltage and sourced from the second input voltage; and
    a latch circuit, coupled to the power detection circuit, and configured to flip respective logic states of a pair of output signals when the output voltage is lower than either the first input voltage or the second input voltage.

9. The circuit of claim 8, wherein each of the first, second, third, and fourth transistors comprises a p-type metal-oxide-semiconductor field-effect-transistor (PMOSFET).

10. The circuit of claim 8, further comprising:
    a selection circuit, coupled to the latch circuit, and configured to use either the first input voltage or the second input voltage as the output voltage based on the respective logic states of the pair of output signals.

11. The circuit of claim 10, wherein the selection circuit further comprises:
    a first switch configured to couple the first input voltage to the output voltage in response to the logic state of one of the pair of output signals; and
    a second switch configured to couple the second input voltage to the output voltage in response to the logic state of the other of the pair of output signals.

12. The circuit of claim 10, wherein the selection circuit further comprises:
    an SR latch circuit configured to receive the respective logic states of the pair of output signals of the latch circuit as inputs.

13. The circuit of claim 8, wherein when the output voltage is equal to one of the first and second input voltages and lower than the other of the first and second input voltages, either currents flowing through the second and third transistors or currents flowing through the first and fourth transistors increase.

14. The circuit of claim 13, wherein the currents flowing through the second and third transistors and the currents flowing through the first and fourth transistors are each a sub-threshold current.

15. The circuit of claim 13, wherein when either the currents flowing through the second and third transistors or the currents flowing through the first and fourth transistors increase, the latch circuit flips the respective logic states of the pair of output signals.

16. A method, comprising:
    providing an output voltage of a voltage selection circuit that is selected to follow one of a first input voltage and a second input voltage of the voltage selection circuit;

using a plurality of transistors that each operates under a sub-threshold mode to monitor whether the output voltage drops below the other of the first and second input voltages; and when the output voltage drops below the other of the first and second input voltages, flipping respective logic states of output signals of a latch circuit so as to cause the output voltage to follow the other of the first and second input voltages, wherein the plurality of transistors comprise:

first transistor gated by the first input voltage and sourced from the second input voltage;

a second transistor gated by the second input voltage and sourced from the first input voltage;

a third transistor gated by the output voltage and sourced from the first input voltage; and     a fourth transistor gated by the output voltage and sourced from the second input voltage.

17. The method of claim 16, wherein each of the first, second, third, and fourth transistors comprises a p-type metal-oxide-semiconductor field-effect-transistor (PMOSFET).

\* \* \* \* \*